(12) United States Patent
Choy

(10) Patent No.: US 7,272,053 B2
(45) Date of Patent: Sep. 18, 2007

(54) INTEGRATED CIRCUIT HAVING A NON-VOLATILE MEMORY WITH DISCHARGE RATE CONTROL AND METHOD THEREFOR

(75) Inventor: Jon S. Choy, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 150 days.

(21) Appl. No.: 11/120,270

(22) Filed: May 2, 2005

(65) Prior Publication Data

US 2006/0104122 A1    May 18, 2006

Related U.S. Application Data

(63) Continuation-in-part of application No. 10/991,879, filed on Nov. 18, 2004, now Pat. No. 7,151,695.

(51) Int. Cl.
    *G11C 11/34* (2006.01)
(52) U.S. Cl. .......................... 365/185.29; 365/185.25; 365/185.33
(58) Field of Classification Search ........... 365/185.29, 365/185.25, 185.33
    See application file for complete search history.

(56) References Cited

U.S. PATENT DOCUMENTS

| | | | |
|---|---|---|---|
| 4,750,078 A | 6/1988 | Ganger et al. | |
| 5,701,090 A | 12/1997 | Hidaka et al. | |
| 5,732,020 A | 3/1998 | Wong et al. | |
| 5,907,506 A | 5/1999 | Jinbo | |
| 5,999,456 A | 12/1999 | Sali et al. | |
| 6,438,032 B1 | 8/2002 | Pekny et al. | |
| 6,445,618 B1 | 9/2002 | Atsumi | |
| 6,456,534 B2 * | 9/2002 | Jinbo | 365/185.25 |
| 6,667,910 B2 | 12/2003 | Abedifard et al. | |
| 6,714,458 B2 | 3/2004 | Gualandri | |

\* cited by examiner

*Primary Examiner*—Anh Phung
*Assistant Examiner*—Pho M. Luu
(74) *Attorney, Agent, or Firm*—Daniel D. Hill

(57) ABSTRACT

An integrated circuit includes a memory (10). The memory (10) includes an array (12) of non-volatile memory cells. Each memory cell (14) of the array (12) includes a plurality of terminals comprising: a control gate, a charge storage region, a source, a drain, a well terminal, and a deep well terminal. Following an erase operation of the array (12), the erase voltages are discharged from each of the memory cells. A discharge rate control circuit (11) controls the discharging of terminals of the memory cell. The discharge rate control circuit (11) includes, for example, a plurality of parallel-connected transistors (112) coupled between the array (12) of non-volatile memory cells and a power supply terminal.

19 Claims, 4 Drawing Sheets

INTEGRATED CIRCUIT HAVING A NON-VOLATILE MEMORY WITH DISCHARGE RATE CONTROL AND METHOD THEREFOR

RELATED APPLICATION

This application is a continuation-in-part of patent application Ser. No. 10/991,879, entitled "Integrated Circuit Having a Non-Volatile Memory with Discharge Rate Control and Method Therefor", by Jon Choy et al., and filed on Nov. 18, 2004 now U.S. Pat. No. 7,151,695.

FIELD OF THE INVENTION

This invention relates generally to integrated circuits, and more particularly to an integrated circuit having a non-volatile memory with discharge rate control of erase voltages.

BACKGROUND OF THE INVENTION

Floating gate non-volatile memories such as erasable programmable read only memories (EPROMs), electrically erasable programmable read only memories (EEPROMs), block erasable ("flash") EEPROMs, and one time programmable read only memories (OTPROMs) are popular for many electronic applications such as automotive control, consumer products such as tapeless answering machines, and the like. In floating gate memories, the state of each memory cell is determined by the amount of charge stored on a floating gate. The floating gate is isolated from an underlying channel by a region of tunnel oxide. Typically, the floating gate transistor is programmed and erased by processes known as Fowler-Nordheim tunneling and hot carrier injection. One process that uses Fowler-Nordheim tunneling for erasing a flash memory is called "channel erase".

A typical flash memory cell manufactured using a "triple well" process may have five terminals that must be properly biased for program and erase operations: a control gate, a source, a drain, a P-well terminal, and a deep N-well terminal. An array of flash memory cells is formed in the P-well. The P-well is isolated within the deep N-well. One technique for performing a channel erase operation on the memory cells of the flash memory array involves applying a relatively high negative voltage, for example about −9 volts, to the control gate, while applying a relatively high positive voltage, for example about +9 volts, to the P-well and the deep N-well. The drain and source of the memory cell are allowed to "float", that is, the drain and source are not directly coupled to a source of potential. However, due to capacitive coupling between the five terminals around the floating gate as well as the diode formed between the drain/source and P-well, the drain and source may float no lower than a diode drop below the P-well/deep N-well voltage.

At the end of an erase operation, the voltage on the five terminals is discharged. If the terminals are allowed to discharge too quickly, an effect of discharging the relatively high negative voltage on the control gate can cause drain, source, and P-well potentials to peak a voltage higher than 10 volts because of the capacitive coupling. The application of a voltage higher than 10 volts may cause the gate oxide of high voltage transistors connected to the nodes of the memory cells to break down, drain source punch through of the transistors connected to the nodes of the memory cell, or other forms of high voltage damage, thus shortening the life of the flash memory.

What would be desirable therefore are a method, and a non-volatile memory using such a method, which prevents the exposure of the high voltage transistors to high voltage beyond the reliability limits. Such a method and a non-volatile memory using that technique is provided by the present invention, whose features and advantages will be more clearly understood from the following detailed description taken in conjunction with the accompanying drawings.

DETAILED DESCRIPTION

Generally, the present invention provides an integrated circuit having a memory. The memory includes an array of non-volatile memory cells. Each memory cell of the array includes a plurality of terminals comprising: a control gate, a charge storage region, a source, a drain, a well terminal, and a deep well terminal. Following an erase operation of the array, the erase voltages are discharged from each of the memory cells. A discharge rate control circuit controls the discharging of the terminals of the erased memory cell. The erase voltages are discharged at a rate in which the capacitive coupling from one of the terminals of the memory cell to other terminals of the memory cell are essentially nulled out, or minimized, for voltage overshoot. After a predetermined time, the erase voltages will be discharged to a level that is safe for devices which are connected to any of the terminals of the memory cell. In one embodiment, all five terminals of a memory cell are recovered, or discharged, at the same time. In other embodiments, less than all of the five terminals may be discharged at the same time. Also, in another embodiment, a discharge circuit is described that recovers the negative voltage against some of the positive voltages that are on the source and drain. This eliminates the need to use charge from other positive power supplies.

In one embodiment, the discharge rate control circuit includes a reference current generator for providing a reference current; a first current mirror, coupled to the reference current generator for providing a first predetermined discharge current for discharging the control gate, drain, and source; and a second current mirror, coupled to the reference current generator, for providing a second predetermined discharge current for discharging the well terminals after the erase operation. In another embodiment, the discharge rate control circuit includes a plurality of parallel-connected transistors coupled between the array of non-volatile memory cells and a power supply terminal. The discharge rate is controlled by selecting which of the parallel-connected transistors are conductive.

Controlling the discharge rate using the discharge rate control circuit in accordance with the illustrated embodiments prevents transistors that are coupled to the memory cells from being damaged because they are exposed to a voltage higher than the reliability limits of the transistors.

Figure 1:
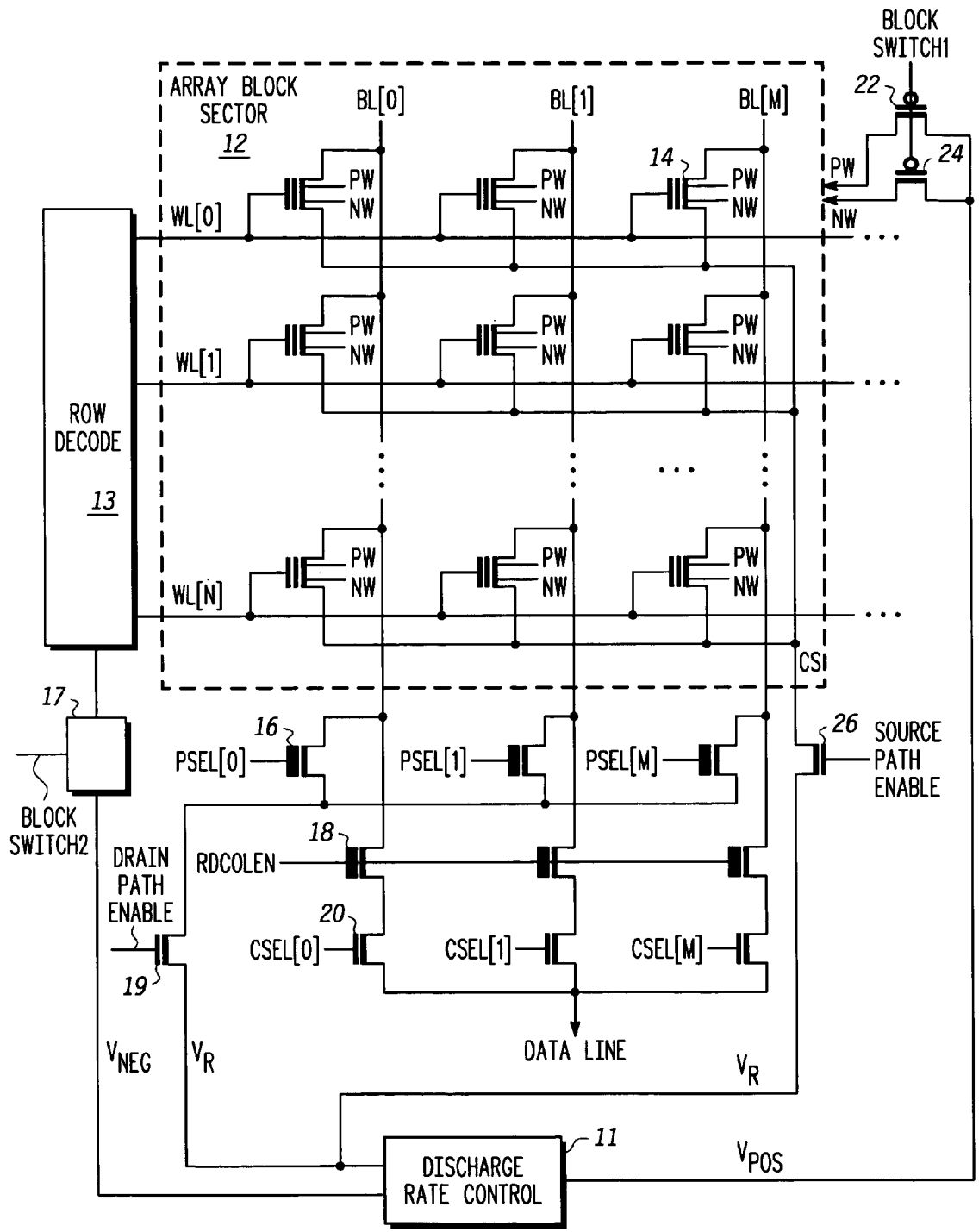
FIG. 1 illustrates, in schematic diagram form, a portion of a non-volatile memory according to the present invention.

FIG. 1 illustrates, in schematic diagram form, a portion of a non-volatile memory 10 in accordance with the present invention. Non-volatile memory 10 is implemented on an integrated circuit and includes an array 12 of non-volatile memory cells coupled at the intersections of word lines and bit lines. Array 12 includes N word lines, where N is an integer, represented by word lines labeled WL[0], WL[1], and WL[N]. Array 12 includes M bit lines, where M is an integer, represented by bit lines labeled BL[0], BL[1], and BL[M]. A non-volatile memory cell 14 is illustrative of the memory cells of the array and includes a control gate coupled to the word line WL[0], a drain coupled to bit line BL[M], a floating gate, a P-well terminal labeled "PW" and a deep N-well terminal labeled "NW". The well terminal PW is coupled to a P-well region of a semiconductor substrate on which the integrated circuit is implemented. Source terminals of all of the memory cells of the array are coupled together and labeled "CS". In the illustrated embodiment, array 12 is a flash memory and is manufactured using a conventional triple-well process and includes a deep N-well for isolating the array. The deep N-well surrounds the P-well within the semiconductor substrate. In another embodiment, the array 12 may be manufactured using a different process that does not include a deep N-well. Also, in another embodiment, the conductivity types of the wells may be different. In addition, the array 12 of the illustrated embodiment includes floating gate transistors. In another embodiment, the array 12 may include another non-volatile memory cell type, such as for example, a SONOS structure where a charge storage layer may include, for example, nitride, nanocrystals, or a combination of nitride and nanocrystals. In addition, the non-volatile memory 10 may be implemented on an integrated circuit as a stand-alone memory, or may be implemented with other circuitry, such as for example, in a microprocessor, or in a microcontroller having a central processing unit (CPU) and one or more peripheral circuits.

A row decoder 13 is coupled to all of the word lines of the array 12. Row decoder 13 is a conventional row decoder and is for selecting one or more word lines, depending on the type of access operation, in response to receiving a row address. A program select transistor is coupled to each of the bit lines and receives one of a decoded program select signal labeled PSEL[0], PSEL[1], and PSEL[M]. For example, a program select transistor 16 has a drain coupled to the bit line BL[0], a gate coupled to receive the program select signal PSEL[0], and a source coupled to the drain of an N-channel transistor 18. Because the N-channel transistors 16 and 18 are exposed to relatively high voltages during program and erase operations, they are implemented using a high voltage CMOS (complementary metal-oxide semiconductor) process as indicated by the thickly drawn gate in FIG. 1. The transistors not exposed to the high program and erase voltages are implemented with thinner gate oxides. Transistors 18 are coupled between the program select transistors and the N-channel column select transistors 20 are for isolating the column select transistors 20 from the relatively higher program and erase voltages. Transistors 18 are always enabled during a read operation and serve as a high voltage isolation device for thinner oxide transistors during program and erase and may not be necessary in other embodiments. Each of the column select transistors, such as transistor 20, is for coupling a corresponding bit line to a data line in response to an asserted one of the column select signals CSEL[0], CSEL[1], and CSEL[M]. In the illustrated embodiment, sense amplifiers (not shown) are coupled to the data lines and are shared between a predetermined number of bit lines. The sense amplifiers are for sensing and amplifying the relatively small currents conducting through the bit lines.

A discharge rate control circuit 11 is provided to discharge the voltages on the terminals of the non-voltage memory cells after an erase operation. The discharge rate control circuit 11 has a first conductor labeled VNEG coupled to the row decoder 13 through the negative block switch 17, and a second conductor labeled VR coupled to the source terminals of the program select transistors through an N-channel transistor 19 that is activated with a signal labeled "DRAIN PATH ENABLE". The negative block switch 17 receives an enable signal labeled "BLOCK SWITCH 2". The second conductor is also coupled to the common source CS of array 12 via an N-channel transistor 26 when a signal labeled "SOURCE PATH ENABLE" is asserted. In addition, the discharge rate control circuit 11 includes a third conductor labeled VPOS coupled to the P-well terminal and the deep N-well terminal via P-channel transistors 22 and 24 in response to a signal labeled "BLOCK SWITCH 1" being asserted. Note that the conductivity type of the illustrated transistors is not important for purposes of describing the invention, and may be different in other embodiments. Also, the transistors 22 and 24 may be separately controlled in other embodiments.

The memory array 12 is erased using a channel erase operation. A relatively high negative voltage, for example about −9 volts, is applied to the control gate of each of the memory cells of the array, while applying a relatively high positive voltage, for example about +9 volts, is applied to the P-well and the deep N-well. The drain and source are allowed to "float" no lower than a diode drop below the P-well, that is, the drain and source are not directly coupled to a source of potential. However, due to capacitive coupling between the five terminals around the floating gate and charging through the junction from the P-well to the drain and source, the drain and source float at a diode drop below the P-well/deep N-well voltage. These voltages are applied to the array 12 for a predetermined amount of time. In other embodiments, the erase voltages may be different and may be applied to different terminals of the memory cells depending on the erase mechanism used.

After the erase operation, it is necessary to discharge the erase voltages from the memory array 12. To prevent high voltage damage to transistors connected to the nodes of the memory cell, the discharge rate control circuit 11 causes the high (or low) negative erase voltage on the gate and the high positive erase voltage on the wells, drains and sources, to be discharged at a rate which will suppress coupling voltage higher than 10V on any of the five terminals from any of the other five terminals. Because the array 12 is a flash memory in the illustrated embodiment, all of the transistors of array 12 are erased at the same time. Likewise, the erase voltages are discharged from all of the transistors at the same time. In one embodiment, array 12 may represent the entire memory array. In other embodiment, array 12 may represent only one of two or more blocks, or sectors, of a non-volatile memory array. The operation of various embodiments of the discharge rate control circuit 11 will be described in more detail below.

Figure 2:
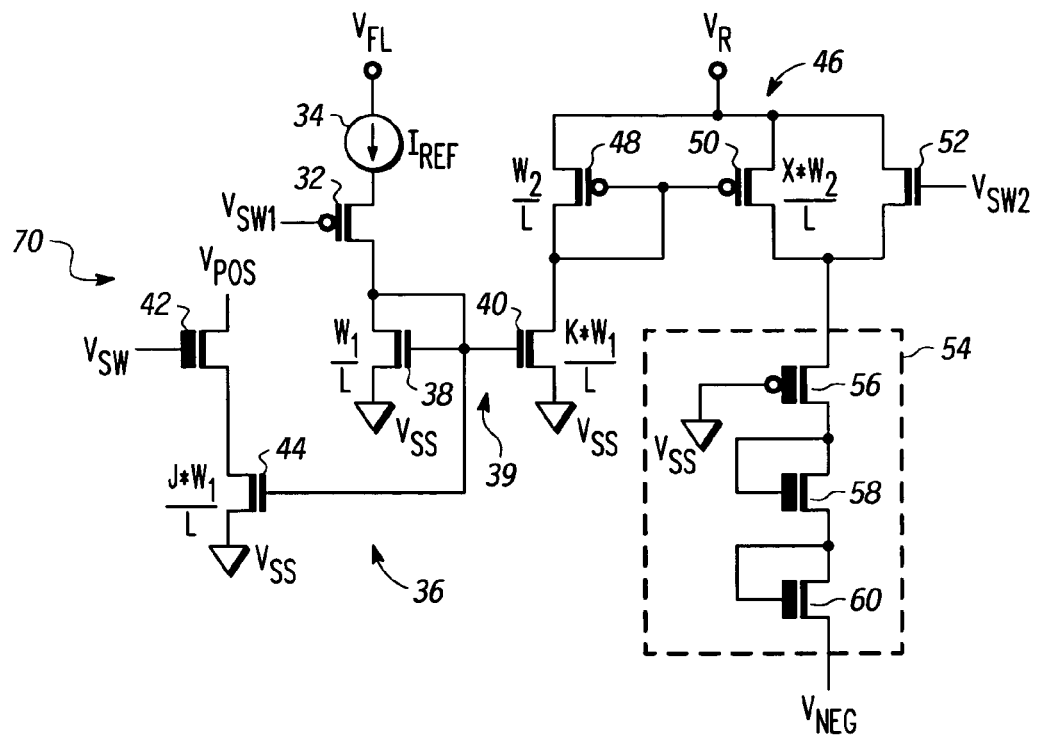
FIG. 2 illustrates, in schematic diagram form, a first embodiment of a discharge rate control circuit for the memory of FIG. 1.

FIG. 2 illustrates, in schematic diagram form, a first embodiment of a discharge rate control circuit 70 for the memory 10 of FIG. 1. Discharge rate control circuit 70 is substituted for the discharge rate control circuit 11 of FIG. 1. Note that throughout the drawings the same reference numbers will be used for the same or similar elements. Discharge rate control circuit 70 includes current source 34, current mirrors 36, 39, and 46, protection circuit 54, P-channel transistor 32, and N-channel transistors 42 and 52. Current mirror 36 includes N-channel transistors 38 and 44. Current mirror 39 includes N-channel transistors 38 and 40. Current mirror 46 includes P-channel transistors 48 and 50. Protection circuit 54 includes P-channel transistor 56 and N-channel transistors 58 and 60. N-channel transistors 42 and 52 and P-channel transistor 32 function as switches.

Current source 34 has a first terminal coupled to a supply voltage terminal labeled $V_{FL}$, and a second terminal for providing a reference current labeled "$I_{REF}$". P-channel transistor 32 has a source coupled to a second terminal of current source 34, a gate coupled to receive a control signal labeled "$V_{SW1}$", and a drain. In the illustrated embodiment, current source 34 is generated based on the bandgap voltage of silicon. In other embodiments, current source 34 may be generated differently. N-channel transistor 38 has a gate and a drain both coupled to the drain of transistor 32, and a source coupled to a supply voltage terminal labeled "$V_{SS}$". N-channel transistor 40 has a drain, a gate coupled to the drain of transistor 32, and a source coupled to $V_{SS}$. N-channel transistor 42 has a drain coupled to a boosted positive voltage terminal labeled "$V_{POS}$", a gate for receiving a control signal labeled "$V_{SW}$", and a source. N-channel transistor 44 has a drain coupled to the source of transistor 42, a gate coupled to the drain of transistor 32, and a source coupled to $V_{SS}$. P-channel transistor 48 has a source coupled to a supply voltage terminal labeled "$V_R$", and a gate and a drain coupled to the drain of N-channel transistor 40. P-channel transistor 50 has a source coupled to $V_R$, a gate coupled to the drain of N-channel transistor 40, and a source. N-channel transistor 52 has a drain coupled to $V_R$, a gate for receiving a control signal labeled "$V_{SW2}$", and a source coupled to the drain of P-channel transistor 50. P-channel transistor 56 has a source coupled to the drain of P-channel transistor 50, a gate coupled to $V_{SS}$, and a drain. N-channel transistors 58 and 60 are diode connected and in series between the drain of transistor 56 and a boosted negative voltage terminal labeled "$V_{NEG}$".

A boosted negative voltage provided to $V_{NEG}$ is used for program and erase operations and is provided by a charge pump (not shown), or may be provided by a voltage source external to the memory 10 in other embodiments. Likewise, a boosted positive voltage provided to $V_{POS}$ is used for the program and erase operations and is provided by another charge pump (not shown), or in other embodiments, may be provided by a voltage source external to memory 10. Because N-channel transistor 42 is exposed to the boosted positive voltage used for the erase operation, it is a high voltage transistor as indicated by the relatively thicker gate in FIG. 2. Protection circuit 54 functions to protect the transistors of current mirror 46 from the boosted negative erase voltage received to $V_{NEG}$. Therefore, the transistors 56, 58, and 60 are also high voltage transistors.

As stated above, the discharge rate control circuit 70 is used to control the discharge of the voltages on the memory cells of array 12 after an erase operation. For example, during the erase operation, a positive 9 volts may be applied to the P-well of each memory cell of the array 12 via $V_{POS}$. The positive 9 volts is discharged through transistors 42 and 44 to $V_{SS}$. Also, during the erase operation a negative 9 volts may be applied to the control gate of each memory cell via $V_{NEG}$. The negative 9 volts is discharged through the protection circuit 54 and transistor 50 and 52 to $V_R$. The discharge rate for each terminal of a memory cell is determined based on a mirror ratio to a known reference. In FIG. 2, the reference current is $I_{REF}$ which is provided by current source 34 to transistor 38 of current mirror 36 & 39. In current mirror 36 & 39, the current through transistor 38 is determined by $I_{REF}$. The current through transistor 40 is determined by adjusting the gate width (W) to gate length (L) ratio relative to the $W_1/L$ ratio of transistor 38 by using a factor "K" as illustrated in FIG. 2. Likewise, the discharge current through transistor 44 is determined by a gate width to gate length ratio factor "J" times $W_1/L$. The factors K and J are generally determined by capacitive loading, and in some embodiments, may be substantially the same. Also, the current through transistor 50 is "X" times $W_2/L$, where $W_2$ is the gate width of transistor 48 and L is the gate length of transistor 48. The current through transistor 48 is determined by the current through transistor 40. Note that in the illustrated embodiment, gate length L is the same for all of the transistors. However, in other embodiments, gate length L may be different for the various transistors.

In operation, discharge rate control circuit 70 is activated when control signal $V_{SW1}$ is asserted as a logic low voltage, $V_{SS}$. Concurrent with, or following the assertion of $V_{SW1}$, control signal $V_{SW}$ is asserted as a logic high, $V_{FL}$, at the gate of transistor 42. Transistor 42 is provided to protect transistor 44 from the relatively high erase voltages as well as to limit the drain source voltage of transistor 44 for more accurate mirroring of the current through transistor 38 and may not be necessary in some embodiments. A current through transistor 38 is mirrored by transistors 40 and 44. A current through transistor 48 is mirrored by transistor 50. The voltage on $V_{NEG}$ is then discharged to $V_R$ and the voltage on $V_{POS}$ is discharged to $V_{SS}$. The factors J, K, and X are chosen to ensure that the memory cell erase voltages begin to discharge at a rate in which the capacitive coupling from one of the terminals of the memory cell to other terminals of the memory cell are essentially nulled out or minimized for voltage overshoot. After a predetermined time, the erase voltages will be discharged to a level that is safe for devices which are connected to any of the terminals of the memory cell. At a later time, the control signal $V_{SW2}$ is asserted as a logic high voltage $V_{FL}$ to make transistor 52 conductive, thus providing another current path for rapidly discharging $V_{NEG}$ and $V_R$.

Discharge rate control circuit 70 will discharge all of the terminals of the memory cells at a rate which will track together and have very little variation due to process, temperature, and supply. Also, discharge rate control circuit 70 provides two recovery, or discharge, rates for $V_{NEG}$ relative to $V_R$; an initial relatively slow recovery to a safe voltage and then a faster recovery rate to shorten recovery time. The illustrated embodiments are especially useful for memories that are operating close to their voltage reliability limits.

Figure 3:
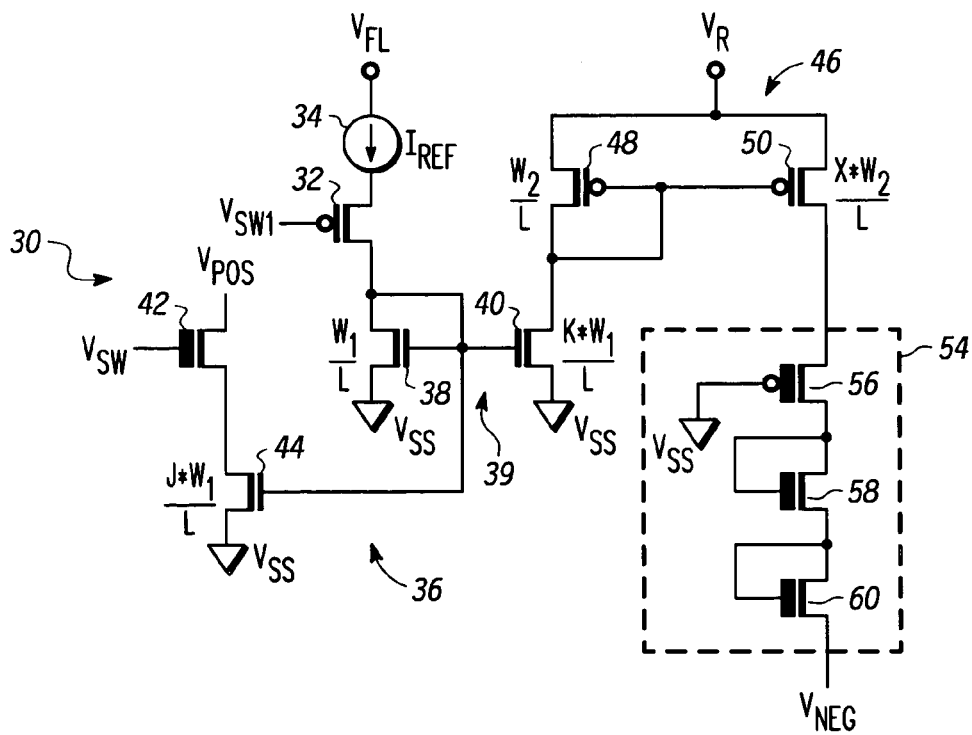
FIG. 3 illustrates, in schematic diagram form, a second embodiment of a discharge rate control circuit for the memory of FIG. 1.

FIG. 3 illustrates, in schematic diagram form, a discharge rate control circuit 30 in accordance with a second embodiment of the present invention. Discharge rate control circuit 30 is substituted for the discharge rate control circuit 11 of FIG. 1. Discharge rate control circuit 30 differs from discharge rate control circuit 70 in that discharge rate control circuit 30 does not have a transistor 52. In circuit 30, the discharge rate remains at the initial rate. However, with careful attention to the determination of the ratio factors J, K, and X, the discharge rate may be relatively quick, especially for those embodiments where there is relatively more margin for device parameters such as oxide breakdown, gate induced junction breakdown, drain-source punch through, and the like.

Figure 4:
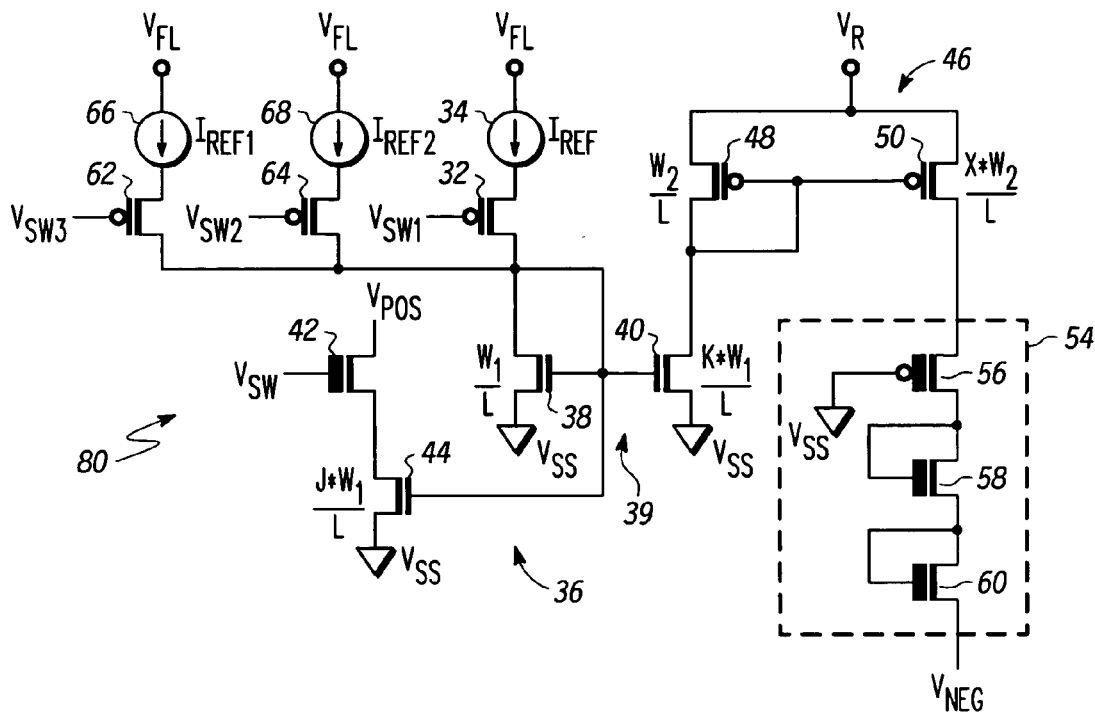
FIG. 4 illustrates, in schematic diagram form, a third embodiment of a discharge rate control circuit for the memory of FIG. 1.

FIG. 4 illustrates, in schematic diagram form, a discharge rate control circuit 80 in accordance with a third embodiment of the present invention. Discharge rate control circuit 80 replaces the discharge rate control circuit 11 in the memory of FIG. 1. Discharge rate control circuit 80 differs from discharge rate control circuit 30 in that discharge rate control circuit 80 includes a plurality of current sources selectively coupled to current mirrors 36 and 39 to provide different rates for discharging the erase voltages from the terminals of the memory cells. FIG. 4 shows two additional current sources 66 and 68 coupled to current mirror 36 and 39 via P-channel transistors 62 and 64, respectively. The P-channel transistor 62 is conductive when control signal $V_{SW3}$ is asserted as a logic low voltage. The P-channel transistor 64 is conductive when control signal $V_{SW2}$ is asserted as a logic low voltage. When control signal $V_{SW3}$ is asserted, current source 66 provides a current $I_{REF1}$ to current mirrors 36 and 39. Likewise, when control signal $V_{SW2}$ is asserted, current source 68 provides a current $I_{REF2}$ to current mirror 36 and 39. Currents $I_{REF1}$ and $I_{REF2}$ may be the same as $I_{REF}$, or different, depending on the desired discharge rates. Note that in other embodiments, there may be more or fewer than three current sources. Each of the current sources is coupled to a separately controlled switch. In the illustrated embodiment, the erase voltages are initially discharged at a low rate by asserting only $V_{SW1}$ for a predetermined time period. After the predetermined time period, control signal $V_{SW2}$ is asserted to add current $I_{REF1}$ to $I_{REF}$ to discharge the memory cells at a second, faster rate. Finally, control signal $V_{SW3}$ is asserted to add the current $I_{REF2}$ to $I_{REF}$ and $I_{REF1}$ to discharge the memory cell nodes at a third rate. Like current source 34, current sources 66 and 68 are bandgap generated. However, in other embodiments, current sources 66 and 68 may be generated in other ways.

Figure 5:
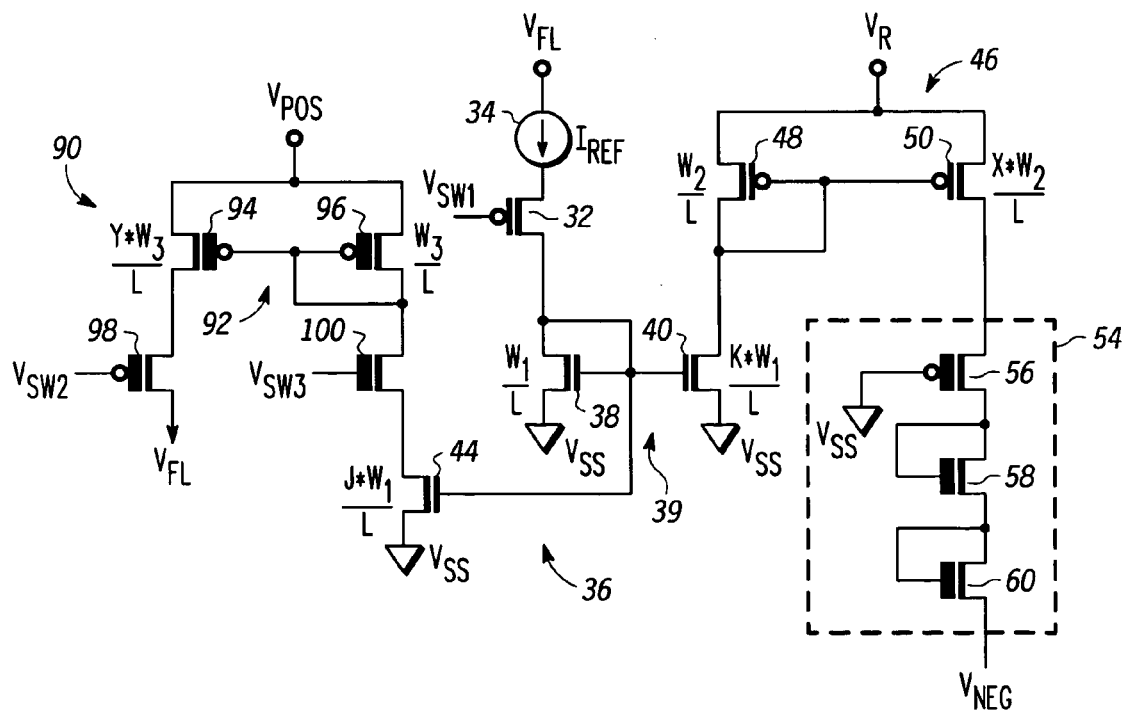
FIG. 5 illustrates, in schematic diagram form, a fourth embodiment of a discharge rate control circuit for the memory of FIG. 1.

FIG. 5 illustrates, in schematic diagram form, a discharge rate control circuit 90 in accordance with a fourth embodiment. Discharge rate control circuit 90 replaces the discharge rate control circuit 11 in the memory of FIG. 1. Discharge rate control circuit 90 differs from discharge rate control circuit 30 in that discharge rate control circuit 90 includes a current mirror 92 coupled to the drain of N-channel transistor 44. Current mirror 92 includes P-channel transistors 94 and 96, and N-channel transistor 100. Transistors 98 and 100 function to enable current flow through transistors 94 and 96. The voltage on transistor 98 must be high enough to disable current from VPOS to $V_{FL}$. In this embodiment, transistor 98 is a thick oxide transistor to help it sustain larger gate voltages. N-channel transistor 100 has a source coupled to the drain of N-channel transistor 44, a gate for receiving a control signal $V_{SW3}$, and a drain. P-channel transistor 96 includes a source coupled to $V_{POS}$, and a gate and a drain coupled to the drain of transistor 100. P-channel transistor 94 has a source coupled to $V_{POS}$, a gate coupled to the drain of transistor 100, and a drain. P-channel transistor 98 has a source coupled to the drain of transistor 94, a gate for receiving control signal $V_{SW2}$, and a drain coupled to $V_{FL}$. A width/length ratio of transistor 94 differs from a width/length ratio of transistor 96 ($W_3/L$) by a factor "Y".

Current mirror 92 is used in FIG. 5 to divert some of the discharged erase voltage from $V_{POS}$ to $V_{FL}$ to "recycle" some of the charge and reduce power consumption of device having memory 10. To discharge $V_{POS}$ after an erase operation, control signals $V_{SW2}$ and $V_{SW3}$ are asserted to make transistors 98 and 100 conductive. Some of the discharge current is provided to $V_{SS}$ through transistors 96, 100, and 44, and some of the discharge current is provided to $V_{FL}$ through transistors 94 and 98. The amount of current from $V_{POS}$ that is provided to $V_{FL}$ is determined, at least in part, by the width/length ratio of transistors 94 and 96 as illustrated in FIG. 5.

Figure 6:
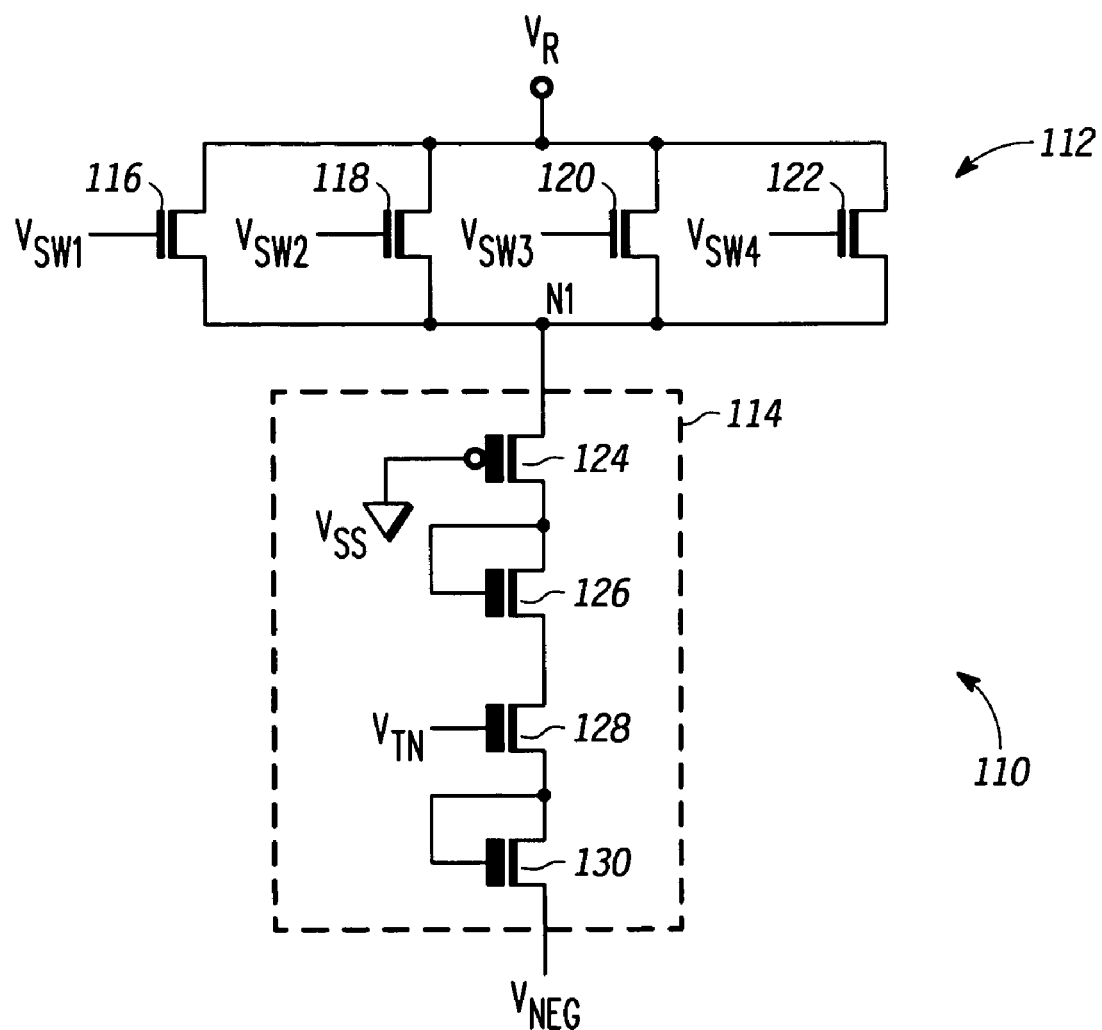
FIG. 6 illustrates, in schematic diagram form, a fifth embodiment of a discharge rate control circuit for the memory of FIG. 1.

FIG. 6 illustrates, in schematic diagram form, a discharge rate control circuit 110 in accordance with a fifth embodiment. Discharge rate control circuit 110 is another embodiment of the discharge rate control circuit 11 in the memory of FIG. 1. Discharge rate control circuit 110 includes a plurality of parallel-connected N-channel transistors 112 and a protection circuit 114. The plurality of transistors 112 includes transistors 116, 118, 120, and 122. The protection circuit 114 includes a P-channel transistor 124, diode-connected N-channel transistors 126 and 130, and an N-channel transistor 128. Each of the plurality of transistors 112 has a current electrode (drain) connected to the power supply voltage terminal VR, a control electrode (gate) for receiving one of control signals $V_{SW1}$, $V_{SW2}$, $V_{SW3}$, and $V_{SW4}$, and a current electrode (source) connected to a node labeled "N1".

In protection circuit 114, P-channel transistor 124 has a source connected to node N1, a gate connected to power supply voltage terminal $V_{SS}$, and a drain. N-channel transistor 126 has a gate and a drain connected to the drain of transistor 124, and a source. N-channel transistor 128 has a drain connected to the source of transistor 126, a gate for receiving a bias voltage labeled "$V_{TN}$", and a source. N-channel transistor 130 has a gate and a drain connected to the source of transistor 128, and a source connected to $V_{NEG}$. Protection circuit 114 functions to protect the plurality of transistors 112 from the boosted negative erase voltage $V_{NEG}$. Therefore, the transistors 124, 126, 128, and 130 are high voltage transistors as indicated in FIG. 6 by the relatively thicker gates. Note that unlike the embodiments illustrated in FIGS. 2-5, discharge rate control circuit 110 does not require the use of voltages $V_{POS}$ or $V_{FL}$.

In operation, discharge rate control circuit 110 discharges the erase voltages from the terminals of the memory cells in FIG. 1 using one or more of the plurality of transistors 112 by asserting one or more of control signals $V_{SW1}$, $V_{SW2}$, $V_{SW3}$, and $V_{SW4}$. In one embodiment of FIG. 6, each of transistors 116, 118, 120, and 122 have the same length and width and will therefore provide substantially the same current flow. In this embodiment, the discharge rate is determined by how many of transistors 116, 118, 120, and 122 are made conductive. Generally, the erase voltage should be initially discharged at a relatively low rate by first asserting only one of the control signals $V_{SW1}$, $V_{SW2}$, $V_{SW3}$, and $V_{SW4}$, for example control signal $V_{SW1}$. After a predetermined time, one or more of the other control signals are asserted in addition to $V_{SW1}$ to increase the discharge rate as desired. The use of four parallel-connected transistors in the illustrated embodiment allows up to four different discharge rates. In other embodiments, there may be more than four or fewer than four parallel-connected transistors to discharge the erase voltages. In another embodiment, the transistors 116, 118, 120, and 122 are each sized to provide different currents. In this embodiment, each of the transistors may be sequentially made conductive to provide additive currents, or may be controlled so that only one transistor is conductive at a time. The discharge charge rate is determined by the combination of transistors 116, 118, 120, and 122 chosen to be conductive. The control logic necessary to provide control signals $V_{SW1}$, $V_{SW2}$, $V_{SW3}$, and $V_{SW4}$ is determined by the application. In one embodiment, the control signals may be provided by a data processor (not shown) used to control operation of memory 10. In another embodiment, the control signals may be provided by a separate control circuit (not shown) used to control memory 10.

As stated above, protection circuit 114 provides high voltage protection to protect the plurality of transistors 112 from damage caused by exposure to the relatively high erase and programming voltages. Because of protection circuit 114, transistors 116, 118, 120, and 122 can use a thinner gate oxide that is rated at a relatively lower voltage than the transistors of protection circuit 114. This results in a lower threshold voltage ($V_T$) and a higher conductance (Gm). Also, the lower $V_T$ provides for smaller process variation between transistors 116, 118, 120, and 122. The smaller process variation results in less impedance variation.

In protection circuit 114, N-channel transistor 128 is provided to prevent a voltage at node N1 from ever being positive. In the illustrated embodiment, the bias voltage $V_{TN}$ is an N-channel threshold voltage of about 0.6 volts. In other embodiments, the bias voltage $V_{TN}$ may be different and depends on the particular process technology used to manufacture memory 10.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
   an array of non-volatile memory cells, each memory cell of the array having a charge storage region and a plurality of terminals;
   a discharge rate control circuit for controlling a discharge rate of one or more of the plurality of terminals of an erased memory cell, the discharge rate control circuit comprising a plurality of parallel-connected transistors coupled between the one or more of the plurality of terminals and a power supply terminal; and
   a high voltage protection circuit, coupled to the discharge rate control circuit, for protecting the plurality of parallel-connected transistors from damage due to exposure to relatively high erase voltages.

2. The integrated circuit of claim 1, wherein the array of non-volatile memory cells comprises an array of flash memory cells.

3. The integrated circuit of claim 1, wherein one or more transistors of the plurality of parallel-connected transistors are conductive for a first predetermined time to provide a first discharge rate, and one or more transistors of the plurality of parallel-connected transistors are conductive for a second predetermined time to provide a second discharge rate higher than the first discharge rate.

4. The integrated circuit of claim 1, wherein the plurality of terminals comprises a control gate, a drain, and a source.

5. The integrated circuit of claim 1, wherein the drain of each of the memory cells of the array is coupled to a corresponding hit line and all of the sources of the array are coupled together.

6. The integrated circuit of claim 1, wherein each transistor of the plurality of parallel-connected transistors has a first current electrode coupled to a first power supply voltage terminal, a control electrode for receiving a control signal, and a second current electrode.

7. The integrated circuit of claim 6, further comprising:
   a first transistor having a first current electrode coupled to the second current electrode of each transistor of the plurality of parallel-connected transistors, a control electrode for receiving a first bias voltage, and a second current electrode;
   a second transistor having a first current electrode and a control electrode both coupled to the second current electrode of the first transistor, and a second current electrode;
   a third transistor having a first current electrode coupled to the second current electrode of the second transistor, a control electrode for receiving a second bias voltage, and a second current electrode; and
   a fourth transistor having a first current electrode and a control electrode both coupled to the second current electrode of the third transistor, and a second current electrode coupled to a second power supply voltage terminal.

8. The integrated circuit of claim 7, wherein the first, second, third, and fourth transistors have a relatively thicker gate oxide than a gate oxide of the plurality of parallel-connected transistors.

9. The integrated circuit of claim 1, wherein the charge storage region is a floating gate of a flash memory cell.

10. An integrated circuit comprising:
    an array of non-volatile memory cells, each memory cell of the array having a control gate, a source, a drain, a first well terminal, and a second well terminal; and
    a discharge rate control circuit for controlling discharging of erase voltages from the control gate, the source, the drain, the first well terminal and the second well terminal of an erased memory cell after an erase operation of the array of non-volatile memory cells, the discharge rate control circuit comprising a plurality of parallel-connected transistors coupled between the array of non-volatile memory cells and a power supply terminal.

11. The integrated circuit of claim 10, wherein the array of non-volatile memory cells comprises an array of flash memory cells.

12. The integrated circuit of claim 10, wherein one or more transistors of the plurality of parallel-connected transistors are conductive for a first predetermined time to provide a first discharge rate, and one or more transistors of the plurality of parallel-connected transistors are conductive for a second predetermined time to provide a second discharge rate higher than the first discharge rate.

13. The integrated circuit of claim 10, wherein the drain of each of the memory cells of the array is coupled to a corresponding bit line and all of the sources of the array are coupled together.

14. The integrated circuit of claim 10, further comprising a high voltage protection circuit for protecting the plurality of parallel-connected transistors from damage due to exposure to relatively high erase voltages.

15. The integrated circuit of claim 10, wherein each transistor of the plurality of parallel-connected transistors has a first current electrode coupled to a first power supply voltage terminal, a control electrode for receiving a control signal, and a second current electrode.

16. The integrated circuit of claim 15, further comprising:
a first transistor having a first current electrode coupled to the second current electrode of each transistor of the plurality of parallel-connected transistors, a control electrode for receiving a first bias voltage, and a second current electrode;
a second transistor having a first current electrode and a control electrode both coupled to the second current electrode of the first transistor, and a second current electrode;
a third transistor having a first current electrode coupled to the second current electrode of the second transistor, a control electrode for receiving a second bias voltage, and a second current electrode; and
a fourth transistor having a first current electrode and a control electrode both coupled to the second current electrode of the third transistor, and a second current electrode coupled to a second power supply voltage terminal.

17. The integrated circuit of claim 16, wherein the first, second, third, and fourth transistors have a relatively thicker gate oxide than a gate oxide of the plurality of parallel-connected transistors.

18. A method for controlling a discharge rate of an erase voltage applied to a non-volatile memory cell, the non-volatile memory cell having a plurality of terminals, the method comprising:
providing a plurality of parallel-connected transistors coupled between one or more terminal(s) of the plurality of terminals;
erasing the non-volatile memory cell by applying the erase voltage to the non-volatile memory cell;
discharging the erase voltage through one or more transistors of the plurality of parallel-connected transistors at a first discharge rate for a first time period; and
discharging the erase voltage through one or more transistors of the plurality of parallel-connected transistors at a second discharge rate for a second time period, wherein the second discharge rate is higher than the first discharge rate and the second time period follows the first time period.

19. The method of claim 18, wherein the plurality of terminals comprises a control gate, a floating gate, a source, a drain, and a well region, the well region being in a semiconductor substrate.

* * * * *

UNITED STATES PATENT AND TRADEMARK OFFICE
CERTIFICATE OF CORRECTION

PATENT NO. : 7,272,053 B2  Page 1 of 1
APPLICATION NO. : 11/120270
DATED : September 18, 2007
INVENTOR(S) : Jon S. Choy It is certified that error appears in the above-identified patent and that said Letters Patent is hereby corrected as shown below:

In Column 10, Line 12, Claim No. 5:

Change "corresponding hit" to --corresponding bit--

Signed and Sealed this

Tenth Day of June, 2008

JON W. DUDAS
*Director of the United States Patent and Trademark Office*